(12) United States Patent
Chuang

(10) Patent No.: US 6,851,925 B2
(45) Date of Patent: Feb. 8, 2005

(54) MECHANISM FOR FAST FASTENING FANS OF SERVER

(75) Inventor: Chih-Peng Chuang, Taipei (TW)

(73) Assignee: Inventec Corporation, Taipei (TW)

( * ) Notice: Subject to any disclaimer, the term of this patent is extended or adjusted under 35 U.S.C. 154(b) by 47 days.

(21) Appl. No.: 10/610,694

(22) Filed: Jul. 2, 2003

(65) Prior Publication Data

US 2005/0002777 A1 Jan. 6, 2005

(51) Int. Cl.[7] ............................................. F04D 29/04
(52) U.S. Cl. .................... 415/126; 416/224 R; 361/695
(58) Field of Search ................................ 415/126, 127, 415/175, 176; 416/244 R; 361/695

(56) References Cited

U.S. PATENT DOCUMENTS

| | | | |
|---|---|---|---|
| 6,288,897 B1 * | 9/2001 | Fritschle et al. | 361/687 |
| 6,556,437 B1 * | 4/2003 | Hardin | 361/687 |
| 6,674,641 B2 * | 1/2004 | Jensen et al. | 361/687 |
| 6,795,314 B1 * | 9/2004 | Arbogast et al. | 361/695 |
| 2004/0130872 A1 * | 7/2004 | Cravens et al. | 361/695 |

* cited by examiner

Primary Examiner—Edward K. Look
Assistant Examiner—Dwayne White
(74) Attorney, Agent, or Firm—Bacon & Thomas PLLC

(57) ABSTRACT

The present invention is to provide a mechanism for fast fastening fans of a server, comprising a fastening frame of hollow parallelepiped shape having at least one divider for dividing an internal space thereof into a plurality of compartments, each compartment being adapted to fasten a fan therein; a plurality of first fastening members each disposed inside the compartment perpendicular to the divider and having a positioning groove abutted on the divider; and a plurality of second fastening member disposed on a housing of the server and being adapted to the corresponding first fastening members so that the fastening frame along with the fans can be assembled to or detached from housing quickly, resulting in an increase of the assembly and maintenance efficiency.

7 Claims, 2 Drawing Sheets

MECHANISM FOR FAST FASTENING FANS OF SERVER

FIELD OF THE INVENTION

The present invention relates to fastening mechanisms and more particularly to an improved mechanism for fast fastening fans of a server by snapping.

BACKGROUND OF THE INVENTION

Fan was invented long time ago. Fans have a wide variety of applications due to the significant progress of electronic and network communication products. Also, features and customization of fans are gradually powerful and advanced respectively for meeting the demand of various electronic and network communication products. For example, an industrial server has a predetermined height of IU (IU=44.45 mm). It is understood that high heat can be generated from electronic components and CPU (central processing unit) of an IU server as it is running at high speed during operation. However, such high heat generated from electronic components cannot be effectively dissipated naturally due to the limited internal space of the IU server. For solving this problem, typically, at least one fan is provided for cooling the IU server in order to lower the surface temperature of the electronic components below an allowable maximum operating temperature. As a result, the IU server can operate normally.

Conventionally, an IU server comprises a fan having dimensions of 40 mm×40 mm×20 mm. Heat dissipation efficiency of the above fan is relatively higher than that of a fan having dimensions of either 30 mm×30 mm×10 mm or 25 mm×25 mm×10 mm. Also, the smaller size of a fan the higher degree of manufacturing difficulty and the higher price of the fan will be. Currently, the above fan having dimensions of 40 mm×40 mm×20 mm is installed in a limited internal space of the IU server due to the consideration of cost, heat dissipation efficiency, and construction.

The current heat dissipation device (i.e., fan assembly) of the IU server comprises first fans mounted adjacent a CPU of the IU server and second fans mounted adjacent a power supply of the IU server. Also, typically, the second fans are threadably secured to a housing of the IU server.

However, the prior fan assembly suffered from several disadvantages. For example, components of the IU server are closely installed in the limited internal space of the IU server. Hence, the above thread secureness of the fans is uneasy, tedious, and time consuming, resulting in an increased difficulty of assembly or maintenance. Moreover, a plurality of fan seats are provided side by side for mounting the fans on the housing of the IU server. Inevitably, the fan seats occupy much of the limited internal space of the IU server, resulting in a further reduction of the available internal space of the IU server. In other words, much precious internal space of the IU server is wasted. Hence, a need for improvement exists.

Thus, it is desirable to provide a mechanism for fast fastening fans of the IU server by snapping in order to carry out a more effective utilization of the limited internal space of the IU server.

SUMMARY OF THE INVENTION

A primary object of the present invention is to provide a mechanism for fast fastening fans of a server for overcoming the above drawbacks of the prior art. These drawbacks are that components of the prior IU server are closely installed in the limited internal space of the IU server by threading, an increased difficulty of assembly or maintenance of the fans, and much of the limited internal space of the IU server is not effectively utilized.

One object of the present invention is to provide a mechanism for fast fastening fans of a server, comprising a fastening frame of hollow parallelepiped shape, the fastening frame comprising at least one divider for dividing an internal space of the fastening frame into a plurality of compartments in a row, each compartment being adapted to fasten a fan therein so that a fan assembly is formed; a plurality of first fastening members each disposed inside the compartment to be abutted on and perpendicular to the divider, each of the first fastening members comprising a positioning groove abutted on the divider; and a plurality of second fastening member disposed on a housing of the server, the second fastening members being adapted to correspond to the first fastening members so that the first and the second fastening members are capable of securing together by snapping the second fastening members in the positioning grooves. As such, the fans can be assembled or detached quickly, resulting in an increase of the assembly and maintenance efficiency.

In one aspect of the present invention the mechanism for fast fastening fans not only has advantages of simple construction, easy manufacturing, and low cost but also has an additional advantage of assembling the fans in the server or detaching the fans from the server by a direct snapping operation without involving of screws. Also, the first fastening member adjacent the divider is provided by completely utilizing unused space in the mechanism without occupying any adjacent longitudinal space of the mechanism. As a result, it is possible of carrying out a more effective utilization of the limited internal space of the server.

The above and other objects, features and advantages of the present invention will become apparent from the following detailed description taken with the accompanying drawings.

DETAILED DESCRIPTION OF THE PREFERRED EMBODIMENTS

Figure 1:
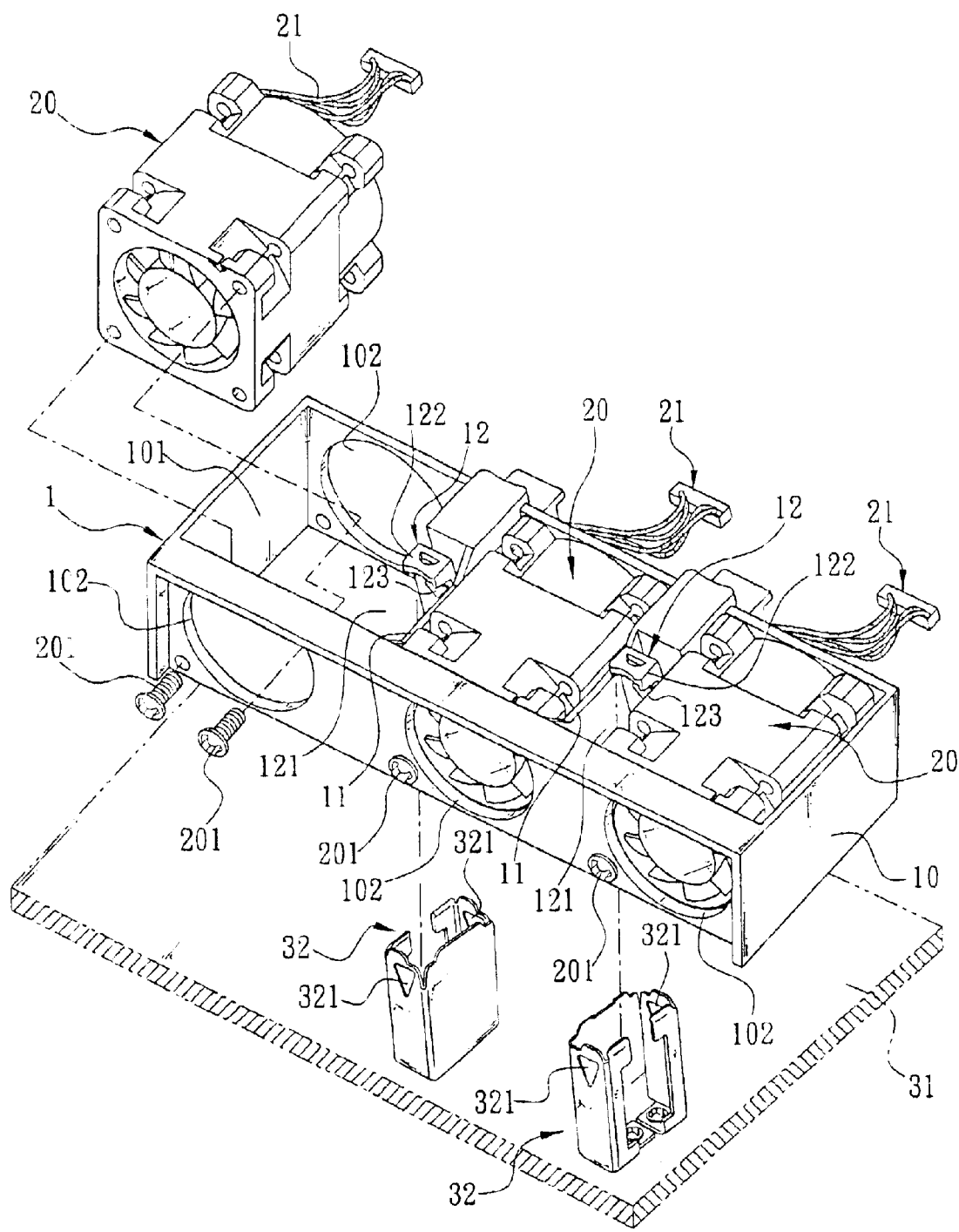
FIG. 1 is an exploded perspective view of a preferred embodiment of fan fastening mechanism according to the invention.
Figure 2:
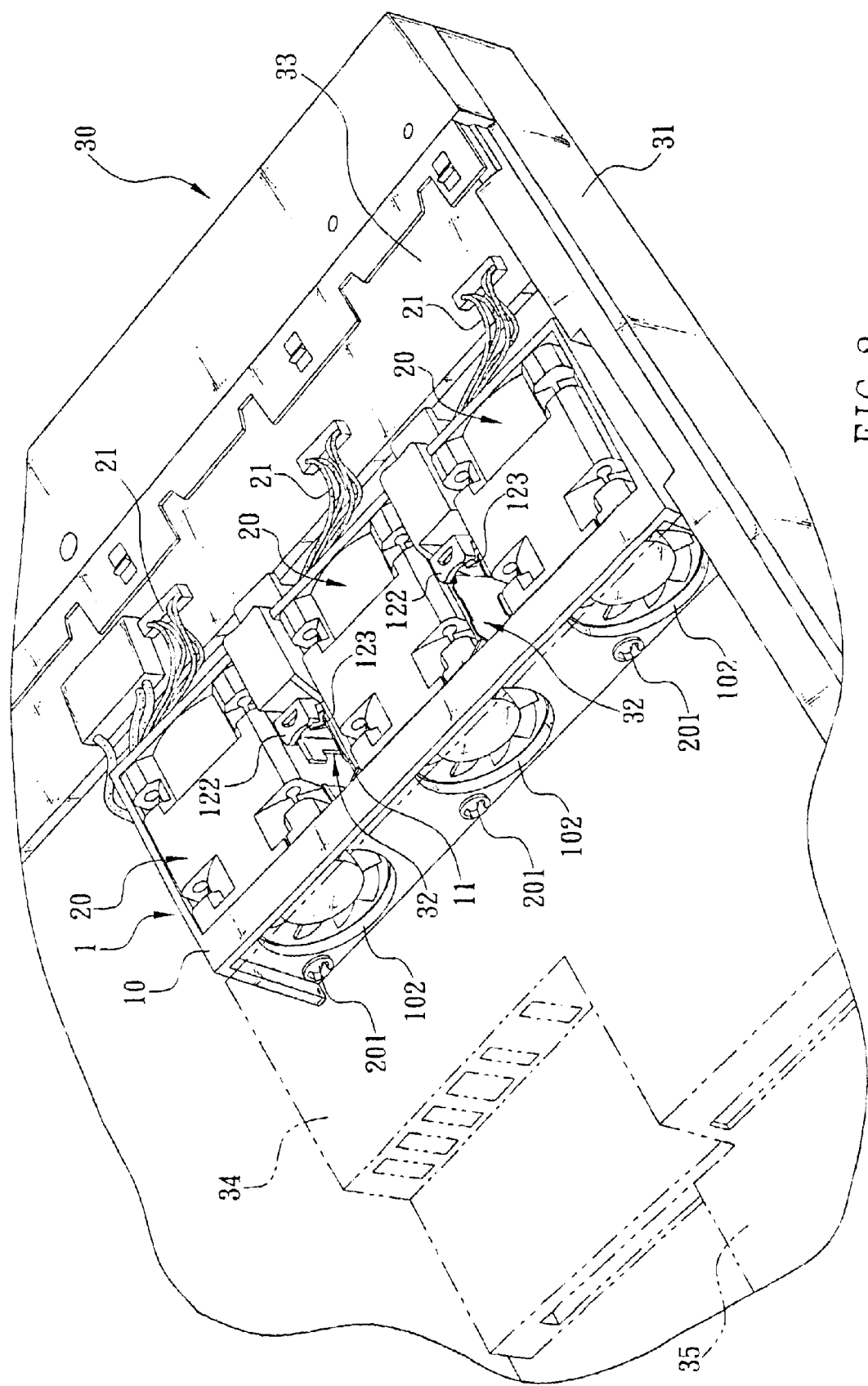
FIG. 2 is a perspective view of the assembled fan fastening mechanism in a server.

Referring to FIGS. 1 and 2, a fan fastening mechanism mounted in a server 30 in accordance with a preferred embodiment of the invention is shown. The server 30 comprises an internal fastening seat 10 as shown in FIG. 1. The fastening seat 10 is a hollow parallelepiped frame. While it is appreciated by those skilled in the art that the fastening seat 10 may have any of other shapes in other embodiments without departing from the scope and spirit of the invention. A divider may be provided in the fastening seat 10 for dividing the internal space of the fastening seat 10 into two compartments. As shown in FIG. 1, two dividers 11 are provided for dividing the internal space of the fastening seat 10 into three compartments 101. Two opposite openings (e.g., front and rear openings) 102 are provided on front and rear walls of the compartment 101 respectively. Preferably, the opening 102 has a circular shape. While it is appreciated by those skilled in the art that the opening 102 may have any of other shapes in other embodiments without departing from the scope and spirit of the invention.

In FIG. 1, a fan 20 is provided in each compartment 101. Also, a plurality of screws 201 are employed to fasten the fan 20 at the front and rear walls of the fastening seat 10. As a result, the fans 20 are secured in the compartments 101. At the same time, outlet of each fan 20 is completely aligned with the front and rear openings 102 so as to output a maximum current of air set up by the fan 20 and effectively reduce resistance to the current of air. Also, a power cord 21 of the fan 20 is extended from the rear wall of the fastening seat 10 to couple to an external power source (not shown).

As shown in FIG. 1, a first fastening member 12 is provided inside the compartment 101 to be abutted on and perpendicular to the divider 11 of the fastening seat 10. The first fastening member 12 is adapted to carry out a fast snap fastening. The first fastening member 12 comprises a positioning groove 121 abutted on the wall of the divider 11. This completes the mechanism 1 for fast fastening of the fans 20.

Referring to FIGS. 1 and 2, it is apparent from the above fastening mechanism 1 that the first fastening member 12 of the fastening mechanism 1 and a second fastening member 32 on a housing 31 of the server 30 are secured together by snapping the second fastening member 32 in the positioning groove 121. As such, the fans 20 can be assembled or detached quickly, resulting in an increase of the assembly and maintenance efficiency. Further, a gap is formed in the second fastening member 32.

Moreover, the first fastening member 12 may take one of a variety of shapes. For example, as shown in FIG. 1 the first fastening member 12 is implemented as a pair of longitudinal flexible arms. A transverse projection 122 is formed at the open top end of either arm. The projection 122 is extended toward the positioning groove 121. A pair of opposite protuberances 123 is provided on the arms facing the positioning groove 121. While it is appreciated by those skilled in the art that the protuberance 123 may be replaced by an element having any of other shapes in other embodiments without departing from the scope and spirit of the invention.

In addition, the second fastening member 32 is implemented as a longitudinal hollow element having a section of U. The second fastening member 32 comprises a cavity 321 at either side. The first fastening member 12 of the fastening mechanism 1 and the second fastening member 32 on the housing 31 are secured together by snapping the second fastening member 32 in the positioning groove 121 of the first fastening member 12. At the same time, the protuberances 123 are inserted in the cavities 321 for fastening (see FIG. 2). As such, the purpose of fast fastening is obtained.

In a disassembly operation of the fastening mechanism 1, simply push the projections 122 outward to deform the arms slightly until the protuberances 123 clear the cavities 321. As an end, the purpose of fast disassembly of the fastening mechanism 1 is obtained.

In the invention, the fans 20 are arranged in a row in the fastening mechanism 1 to form a fan assembly. As such, optimum currents of air are set up by the fans 20 for carrying out sufficient heat dissipation of the server 30. Also, the second fastening members 32 are provided on the housing 31 of the server 30 between an interface circuit board 33 and a DC (direct current) to DC converter 34 in front of a power supply 35. Hence, power of each fan 20 in the fastening mechanism 1 can be fed from the power cord 21 coupled to the interface circuit board 33. At the same time, currents of cold air from the outlets of the fans 20 can completely blow toward the converter 34 and the power supply 35 for effectively cooling the same.

In the invention, a width of the fastening mechanism 1 is designed to be the same as that of the power supply 35 in the housing 31 of the server 30. As such, the first fastening members 12 adjacent the dividers 11 are provided by completely utilizing unused space in the fastening mechanism 1 without occupying any adjacent longitudinal space of the fastening mechanism 1. As a result, it is possible of carrying out a more effective utilization of the limited internal space of the server 30.

As stated above, the mechanism 1 for fast fastening of the fans 20 not only has advantages of simple construction, easy manufacturing, and low cost but also has an additional advantage of securing the mechanism 1 and the second fastening members 32 in the housing 31 of the server 30 together by a direct snapping operation without involving of screws. As an end, the purposes of fast assembly and disassembly of the fans 20 are obtained. Moreover, the invention is lightweight, easy in operation, convenient in disassembly, simple, and ergonomic.

While the invention has been described by means of specific embodiments, numerous modifications and variations could be made thereto by those skilled in the art without departing from the scope and spirit of the invention set forth in the claims.

What is claimed is:

1. A mechanism for fast fastening fans of a server, comprising:
    a fastening frame of hollow parallelepiped shape, the fastening frame comprising at least one divider for dividing an internal space of the fastening frame into a plurality of compartments each having two opposite openings on front and rear walls respectively, a plurality of first fastening members each disposed inside the compartment to be abutted on and perpendicular to the divider, each of the first fastening members comprising a positioning groove abutted on the divider;
    a plurality of fans each disposed in each of the compartments and having an outlet completely aligned with the front and the rear openings; and
    a plurality of second fastening member disposed on a housing of the server, the second fastening members being adapted to correspond to the first fastening members so that the first and the second fastening members are capable of securing together by snapping the second fastening members in the positioning grooves.

2. The mechanism of claim 1, wherein the first fastening member is a pair of longitudinal flexible arms each comprising a transverse projection at an open top end extended toward the positioning groove and a pair of opposite protuberances facing the positioning groove.

3. The mechanism of claim 1, wherein the second fastening member is of longitudinal hollow shape having a section of U, the second fastening member comprising a cavity at either side.

4. The mechanism of claim 3, wherein the second fastening members are disposed on the housing of the server between an interface circuit board and a converter in front of a power supply.

5. The mechanism of claim 4, wherein power of each of the fans is fed from a power cord extended from one side of the fastening frame to couple to the interface circuit board.

6. The mechanism of claim 4, wherein a width of the fastening frame is equal to that of the power supply in the housing of the server.

7. The mechanism of claim 1, wherein the fans are arranged in a row in the fastening frame to form a fan assembly.

* * * * *